United States Patent
Vijayaraghavan et al.

(10) Patent No.: US 9,170,952 B1
(45) Date of Patent: Oct. 27, 2015

(54) CONFIGURABLE MULTI-STANDARD DEVICE INTERFACE

(75) Inventors: Divya Vijayaraghavan, Los Altos, CA (US); Vinson Chan, San Jose, CA (US); Keith Duwel, San Jose, CA (US); Chong H. Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 183 days.

(21) Appl. No.: 13/338,707

(22) Filed: Dec. 28, 2011

(51) Int. Cl.
| | |
|---|---|
| *G06F 13/00* | (2006.01) |
| *G06F 12/02* | (2006.01) |
| *G06F 12/08* | (2006.01) |
| G06F 13/12 | (2006.01) |
| G06F 13/14 | (2006.01) |
| G06F 11/00 | (2006.01) |
| H01L 25/00 | (2006.01) |
| H04J 3/06 | (2006.01) |

(52) U.S. Cl.
CPC ............ *G06F 12/0862* (2013.01); *G06F 13/00* (2013.01)

(58) Field of Classification Search
CPC ..... G06F 13/42; G06F 15/16; G06F 12/0862; G06F 12/0246
USPC ........ 710/104, 71, 305; 370/235, 350; 326/41
See application file for complete search history.

(56) References Cited

U.S. PATENT DOCUMENTS

| | | | | |
|---|---|---|---|---|
| 5,592,629 | A * | 1/1997 | Gamble | 710/51 |
| 6,113,260 | A * | 9/2000 | Genrich et al. | 714/795 |
| 7,107,393 | B1 * | 9/2006 | Sabih | 711/109 |
| 7,598,768 | B1 * | 10/2009 | Tetzlaff et al. | 326/38 |
| 7,724,903 | B1 * | 5/2010 | Kryzak et al. | 380/265 |
| 7,787,387 | B2 * | 8/2010 | Huff | 370/248 |
| 7,835,375 | B2 * | 11/2010 | Sarkinen et al. | 370/401 |
| 7,937,601 | B2 * | 5/2011 | Bakker et al. | 713/330 |
| 8,155,136 | B2 * | 4/2012 | Lin et al. | 370/420 |
| 8,204,074 | B2 * | 6/2012 | Pantelias | 370/463 |
| 8,477,831 | B2 * | 7/2013 | Vijayaraghavan et al. | 375/220 |
| 8,509,616 | B2 * | 8/2013 | Julien et al. | 398/45 |
| 2005/0058187 | A1 * | 3/2005 | Groen et al. | 375/219 |
| 2007/0165663 | A1 * | 7/2007 | Aloni et al. | 370/420 |
| 2008/0079462 | A1 * | 4/2008 | Chiu et al. | 326/115 |
| 2011/0320854 | A1 * | 12/2011 | Elrabaa | 713/600 |
| 2012/0082171 | A1 * | 4/2012 | Georgiou et al. | 370/466 |
| 2012/0327769 | A1 * | 12/2012 | Ghiasi et al. | 370/235 |

OTHER PUBLICATIONS

Ilango, Ganga, IEEE 802.eba 40 and 100 Gigabit Ethernet Architecture, Oct. 2012.*
Ali Ghiasi, Application Space of CAUI-4/OIF-VSR and cPPI-4, Sep. 15, 2011.*

* cited by examiner

*Primary Examiner* — Thomas J Cleary
*Assistant Examiner* — Christopher A Daley
(74) *Attorney, Agent, or Firm* — Ropes & Gray LLP

(57) ABSTRACT

A configurable interface includes a transmitter module and a receiver module, each configured to operate according to at least three different interface standards. The configurable interface further includes an interface module configured to determine a physical medium attachment (PMA) standard of a PMA coupled to the configurable interface and activate at least one component of the configurable interface based on the PMA standard. In an arrangement, the device interface supports a CAUI-4 standard.

18 Claims, 6 Drawing Sheets

CONFIGURABLE MULTI-STANDARD DEVICE INTERFACE

BACKGROUND OF THE INVENTION

This invention relates to a device interface, especially in a programmable integrated circuit device, such as a programmable logic device (PLD), which may operate according to different interface standards.

A physical coding sublayer (PCS) interface included within a device processes data for transmission to, or that is received from, a physical medium attachment (PMA) coupled to an external device. PCS interfaces are often designed to support a specific PMA standard, for example, a CAUI or XLAUI standard.

Thus, one device may include a PCS interface designed to operate according to a XLAUI standard of 40 Gb/s using four physical lanes of 10 Gb/s each, while another device may include a PCS interface design to operate according to a CAUI standard of 100 Gb/s using 10 physical lanes of 10 Gb/s each. New standards continue to emerge. For example, a CAUI-4 standard uses four physical lanes at 25 Gb/s each. Emergent standards render obsolete older PCS interface designs and limit the applicability of any single PCS interface design. For example, high-end field programmable gate arrays (FPGAs) may be utilized in applications requiring high speed serial interfaces compliant with a wide range of standards based on 4×10 Gb/s, 10×10 Gb/s and 4×25 Gb/s Ethernet standards. Many PCS interfaces, however, are capable of operating only according to a single standard. Such PCS interfaces may need to be largely redesigned as new standards emerge.

SUMMARY OF THE INVENTION

Described herein are systems, devices, and methods for providing a first configurable interface. The first configurable interface includes a transmitter module and a receiver module, each of which is capable of operating according to at least three different interface standards. The first configurable interface also includes an interface module that is capable of determining a PMA standard of a PMA coupled to the first configurable interface. The interface module is also capable of activating at least one component of the first configurable interface in response to the determined PMA standard.

In certain implementations of the first configurable interface, the at least one component includes an adaptor unit and/or a gearbox module of the receiver module. In certain implementations of the first configurable interface, the at least three different interface standards includes a CAUI-4 standard.

In certain implementations of the first configurable interface, the receiver module includes an adaptor unit that includes at least four gearbox modules. In certain implementations of the first configurable interface, the receiver module includes at least six gearbox modules.

In certain implementations of the first configurable interface, a gearbox module is capable of receiving a set of data as input at a first data rate according to a first clock rate, and producing the set of data as output at a second data rate according to a second clock rate. The first data rate, the second data rate, the first clock rate, and the second clock rate are chosen so that the gearbox module operates as a stable buffer between the input and output.

Also described herein are systems, devices, and methods for providing a second configurable interface. A PMA standard of a PMA coupled to an integrated circuit device is determined, and a group of operating parameters of the second configurable interface is selected based on the determined PMA standard that is selected.

In certain implementations of the second configurable interface, the PMA standard is a CAUI-4 standard. In certain implementations of the second configurable interface, the group of operating parameters includes a maximum number of virtual lanes and/or a number of virtual lanes used by the PMA.

In certain implementations of the second configurable interface, a component of the integrated circuit device is deactivated in response to the determined PMA standard and the component may be an adaptor unit of the integrated circuit device. The adaptor unit may include four gearbox modules.

Also described herein are systems, devices, and methods for providing a third configurable interface. The third configurable interface includes an interface module capable of determining a PMA standard of a PMA coupled to the third configurable interface, and a configuration module capable of setting a group of operating parameters of the third configurable interface based on the determined PMA standard.

In certain implementations of the third configurable interface, the PMA standard is a CAUI-4 standard. In certain implementations of the third configurable interface the group of operating parameters includes a maximum number of virtual lanes and/or a number of virtual lanes used by the PMA.

In certain implementations of the third configurable interface, the configuration module is further capable of activating a gearbox module in response to the determined PMA standard. In certain implementations of the third configurable interface, the configuration module is further capable of activating a CAUI-4 adaptor unit in response to the determined PMA standard.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
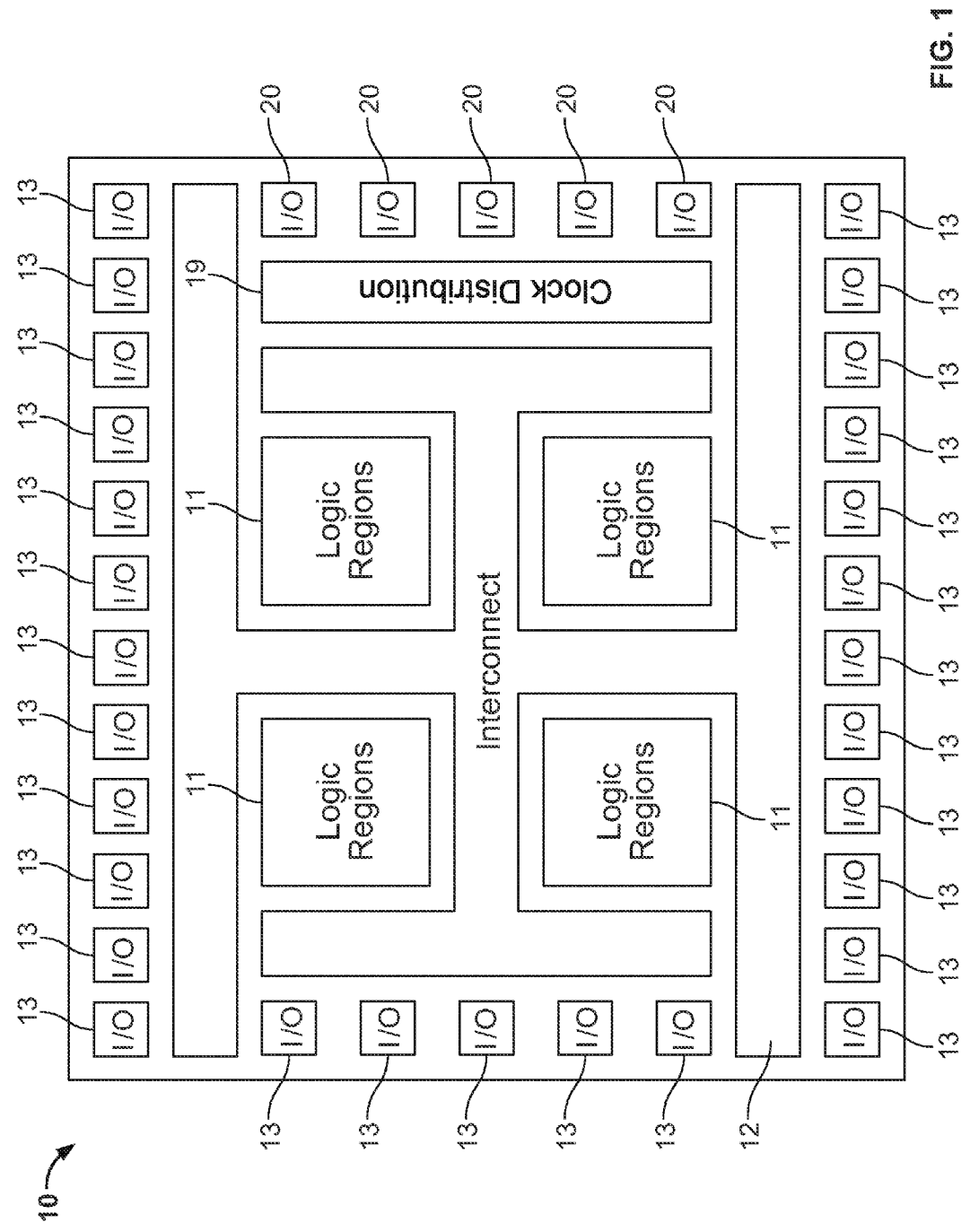
FIG. 1 is a block diagram of a preferred embodiment of a PLD in which the present invention may be used.

A PLD 10, shown schematically in FIG. 1, is one example of a programmable device including an interface incorporating the invention. The PLD 10 has a programmable logic core including programmable logic regions 11 accessible to a programmable interconnect structure 12. The layout of the logic regions 11 and the interconnect structure 12 as shown in FIG. 1 is intended to be schematic only, as many actual arrangements are known to, or may be created by, those of ordinary skill in the art.

The PLD 10 also includes a plurality of other input-output (I/O) regions, referred to as I/O regions 13. Each of the regions in the I/O regions 13 is preferably programmable, allowing the selection of one of a number of possible signaling schemes. Alternatively, each of the I/O regions 13 may be fixed and allow only a particular signaling scheme. In some embodiments, a number of different types of fixed I/O regions may be provided in the PLD 10, so that while each region is fixed, the PLD 10 as a whole allows a selection of various signaling schemes.

Each of the I/O regions 20 is preferably a high-speed interface, preferably including a plurality (N) of PCS transmit and receive channels, although only a single PCS transmit channel 21 is shown.

The PLD 10 also includes a clock distribution area 19. The clock distribution area 19 includes one or more clock signals from which clock signals are provided to various other elements of the PLD 10. In preferred implementations, the clock distribution area 19 includes at least one clock signal that operates at a speed greater than or equal to the highest clock speed requirement by any component of the PLD 10.

Figure 2:
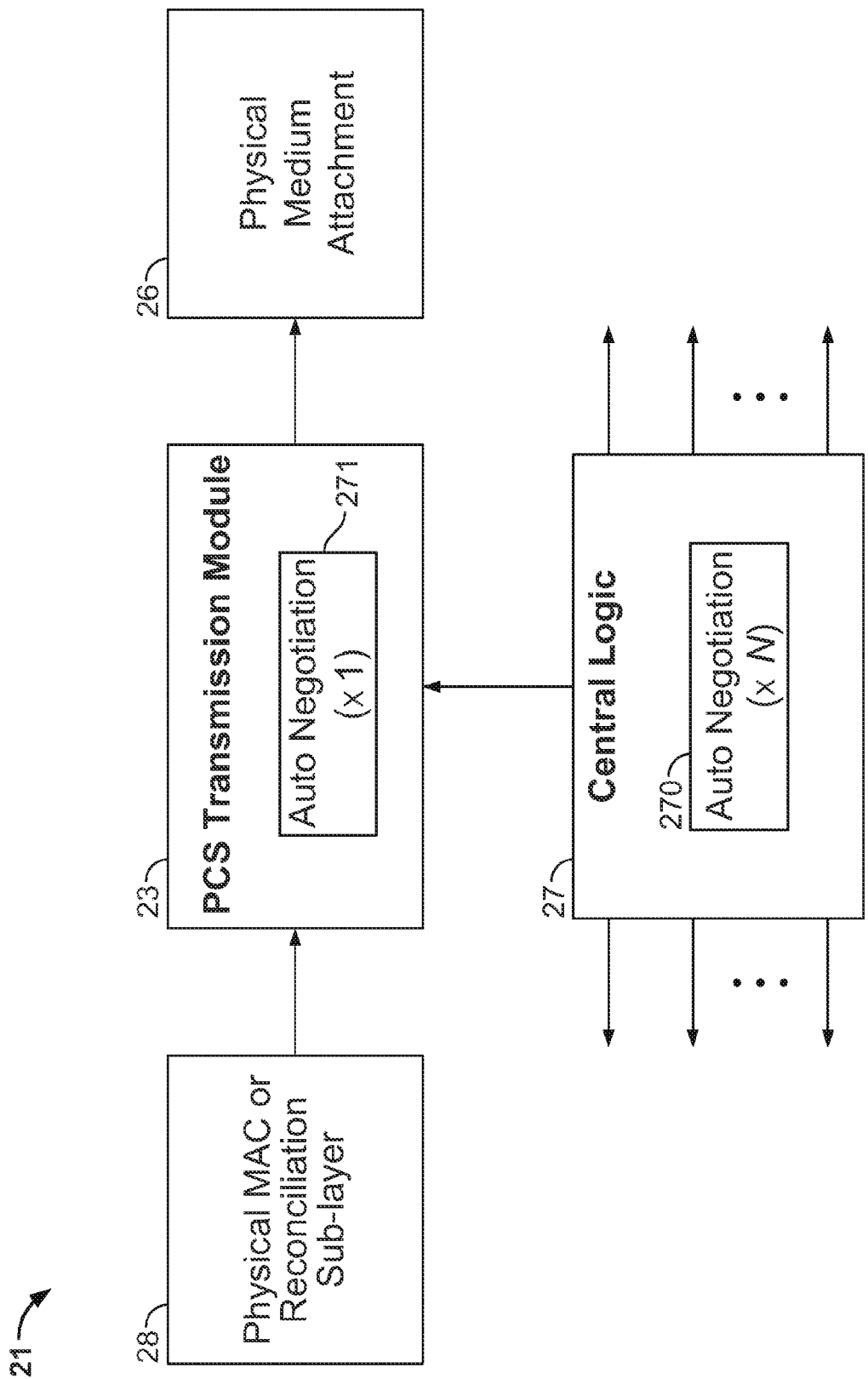
FIG. 2 is a schematic diagram of a PCS transmit channel in accordance with the present invention.

FIG. 2 is a schematic diagram of a PCS transmit channel 21 in accordance with the present invention. The PCS transmit channel 21 includes a PMA module 26, and a PCS transmission module 23 that supports a plurality of different standards according to the present disclosure. The PCS transmit channel 21 may be included in the I/O regions 20. Central logic 27 may be shared by a plurality of PCS transmit channels from the I/O regions 20, including the PCS transmit channel 21, and may include an automatic speed negotiation module 270 for use in situations where all of the PCS transmit channels are used with the same standard. The PCS transmit channel 21 may also include a dedicated automatic speed negotiation module 271 that may be used in situations where the plurality of PCS transmit channels use different standards. Preferably, the automatic speed negotiation module 271 is identical to the automatic speed negotiation module 270, although that is not necessary. The PCS transmission module 23 may be connected to a physical MAC reconciliation sublayer (PHY/MAC) 28 or other connection to a remote communication fabric. A PCS receive channel included in the I/O regions 20 may include a similar design architecture to that shown in FIG. 2, but with data flow proceeding from a PMA module through a PCS receive module and to a PHY/MAC or other connection to a remote communication fabric.

Figure 3:
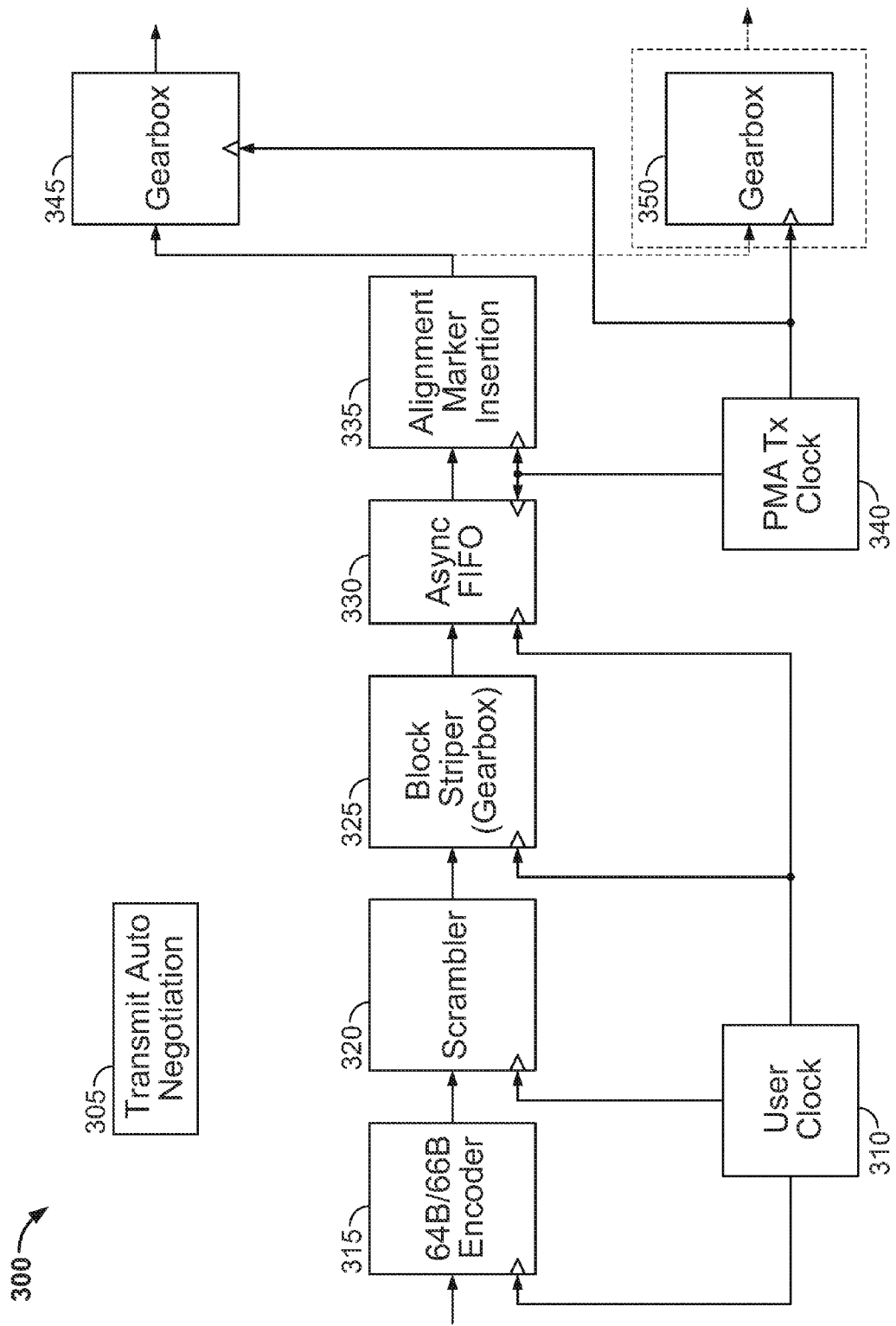
FIG. 3 is a schematic diagram of an exemplary PCS transmit module in accordance with the present invention.

FIG. 3 is a schematic diagram of an exemplary PCS transmit module 300 in accordance with the present invention. The PCS transmit module 300 may correspond to a more detailed diagram of the PCS transmission module 23. As will be further described in the following, the PCS transmit module 300 is an adaptive architecture that is capable of adapting to a variety of standards depending on properties of the PMA module 26. In certain implementations, the PCS transmit module 300 adapts by automatically setting one or more parameters to values characteristic of a given standard used by the PMA module 26. In certain implementations, the PCS transmit module 300 adapts by automatically activating or deactivating device components (e.g., one or more gearboxes) and adaptor units (e.g., a gearbox adaptor unit).

The terms gearbox and gearbox module as referred to herein describe logic (e.g., circuitry) for translating a first data rate and/or data width at an input to the logic into a second data rate and/or data width at the output of the logic. As an illustrative example, a gearbox may receive data at an input width of 66 bits per virtual channel and may convert this data to a width of 40 bits per virtual channel at an output of the gearbox. Further, a total number of virtual channels at the output of a gearbox may be different from a total number of virtual channels at the input to the gearbox. Data may be input to a gearbox according to a first data clock and output from the gearbox according to a second (e.g., faster or slower) data clock.

Turning to further implementational details of the PCS transmit module 300, data flow from the PHY/MAC 28 is received by an encoder 315 at a rate of 64×VL_USER bits per clock cycle, where VL_USER is a positive integer-value parameter (e.g., 2, 4, or 8) that describes a degree of parallelization of data in the PCS transmit module 300. The encoder 315 is a 64B/66B encoder that converts 64×VL_USER bits of input data into 66×VL_USER bits of output data per clock cycle. For example, the encoder 315 may append a preamble such as '10' or '01' to each block of 64 bits of input data to produce a corresponding output of 66 bits.

The output of the encoder 315 is provided to a scrambler 320. The scrambler 320 thus receives 66×VL_USER bits of input data per clock cycle. The scrambler 320 rearranges, or permutes, the input bits of data with the purpose of producing as output a more even distribution of '1' valued bits and '0' valued bits throughout the data. The scrambler 320 may be implemented using a linear feedback shift register. The scrambler 320 outputs 66×VL_USER bits of input data per clock cycle.

The output of the scrambler 320 is provided to a block striper 325. The block striper 325 converts a single stream of input data into outputs across a number of virtual lanes equal to parameter VL_MAX. In certain implementations, VL_MAX is equal to 20 for 100 Gb/s standards (e.g., a CAUI or CAUI-4 standard) and equal to 4 for 40 Gb/s standards (e.g., a XLAUI standard). In certain implementations the block striper 325 allocates input bits to the VL_MAX virtual lanes in a round-robin fashion in 66-bit blocks. The output of block striper is 66×VL_MAX bits per clock cycle.

As shown in FIG. 3, each of the encoder 315, the scrambler 320, the block striper 325, and an asynchronous first-in first-out (FIFO) module 330 operate according to a user clock 310. In certain implementations, the user clock 310 is derived from a clock signal from the clock distribution area 19. In certain implementations, the user clock 310 operates at a frequency of about 195.31 MHz.

As will further described below, other components of the PCS transmit module 300 operate according to a different clock signal derived from the PMA module 26 referred to as a PMA Tx clock 340 (the asynchronous FIFO module 330 operates according to both the user clock 310 and the PMA Tx clock 340). In particular, the PMA Tx clock 340 may operate at about 257 MHz, though the rate of the PMA Tx clock 340 will generally depend on the standard used by the PMA module 26.

The output of the block striper 325 is provided as input to the asynchronous FIFO module 330. The asynchronous FIFO module 330 includes one interface for writing input data to a FIFO buffer according to the user clock 310 and another interface for reading data from the FIFO buffer according to the PMA Tx clock 340. The asynchronous FIFO module 330 produces output at a rate of 66×VL_MAX bits per clock cycle of the PMA Tx clock 340.

The output of the asynchronous FIFO module 330 is input to an alignment marker module 335. The alignment marker module 335 inserts alignment markers into the input virtual lanes. In certain implementations, the alignment marker module 335 inserts markers (e.g., blocks of data) periodically into each input virtual lane after every (roughly) 16,000 blocks, where each block is in length 66-bits. The inserted markers may be used to deskew virtual lanes at a receiver (i.e., to line up virtual lanes and correct for any misalignment among the virtual lanes in received data). In certain implementations, the markers are inserted in place of interpacket gaps in the input to the asynchronous FIFO module 330. In these implementations, the asynchronous FIFO module 330 produces an output at a rate of 66×VL_MAX bits per clock cycle of the PMA Tx clock 340.

The output of the asynchronous FIFO module 330 may be provided to one or both of a gearbox 345 and the gearbox 350. In certain 40 Gb/s implementations (e.g., a XLAUI standard), only the gearbox 345 is active and the number of virtual lanes used by the PMA module 26, referred to as VL_PMA, is equal to 4. The total output per clock cycle of the PMA Tx clock 340 in this implementation may be 40 bits×VL_PMA. In certain 100 Gb/s implementations (e.g., a CAUI and CAUI-4 standard), both the gearbox 345 and the gearbox 350 are active and VL_PMA is equal to 10. The total output per clock cycle of the PMA Tx clock 340 in this implementation may be 20 bits×VL_PMA per active gearbox (for a total output of 40 bits×VL_PMA per clock cycle).

The PCS transmit module may include a transmit auto negotiator 305. Transmit auto negotiator 305 may be used to determine a standard and/or properties of the PMA module 26.

Although the PCS transmit module 300 has been described as producing a total output of 40 bits per virtual lane of the PMA module 26, it will be clear to one of ordinary skill in the art, based on the disclosure herein, that PCS transmit module 300 may be implemented using any other suitable bit-width. For example, the PCS transmit module 300 may output 32 bits per virtual lane of the PMA module 26. Further, in certain implementations, the PCS transmit module 300 is adaptive to determine a suitable bit-width based on one or more characteristics of the PMA module 26. Further, although not explicitly shown in FIG. 3, it will be clear to one of ordinary skill in the art, based on the disclosure herein, that various components of the PCS transmit module 300 may receive as input a data select or "wait and hold" signal that may be used to trigger access of data from those components.

Figure 4:
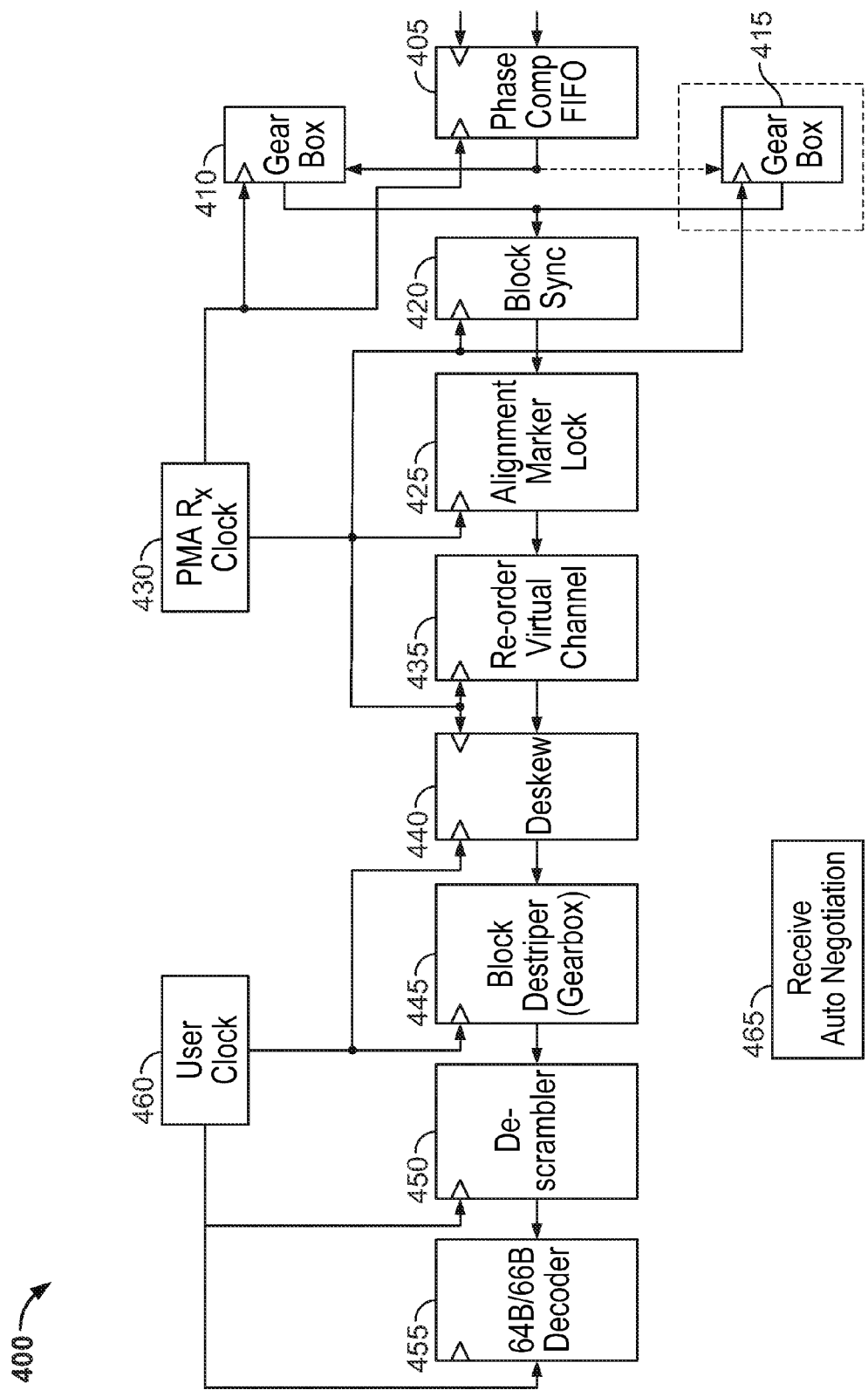
FIG. 4 is a schematic diagram of an exemplary PCS receive module in accordance with the present invention.

FIG. 4 is a schematic diagram of an exemplary PCS receive module 400 in accordance with the present invention. As will be further described in the following, the PCS receive module 400 is an adaptive architecture that is capable of adapting to a variety of standards depending on the properties of the PMA module 26. In certain implementations, the PCS receive module 400 adapts by automatically setting one or more parameters to values characteristic of a given standard used by the PMA module 26. In certain implementations, the PCS receive module 400 adapts by automatically activating or deactivating device components (e.g., one or more gearboxes) and adaptor units (e.g., gearbox adaptor units). The PCS transmit module may include a receive auto negotiator 465. The receive auto negotiator 465 may be used to determine the standard and/or properties of the PMA module 26.

Turning to further implementational details of the PCS receive module 400, data flow from the PMA module 26 is received by a phase compensation module 405 at a rate of 40×VL_PMA bits per clock cycle of the PMA module 26. The phase compensation module 405 translates the input, received according to a clock of the PMA module 26, into a clock domain of a PMA Rx clock 430 (and receives clocking signals from both the PMA Rx clock 430 the clock of the PMA module 26 as input). In certain implementations, the phase compensation module 405 includes one interface for writing input data to a FIFO buffer according to a clock of the PMA module 26 and another interface for reading data from the FIFO buffer according to the PMA Rx clock 430. The phase compensation module 405 produces output at a rate of 40×VL_PMA bits per clock cycle of the PMA Rx clock 430.

The output of the phase compensation module 405 may be provided to one or both of a gearbox 410 and a gearbox 415. In certain 40 Gb/s implementations (e.g., a XLAUI standard), only the gearbox 410 is active and a total output from the gearbox 410 per clock cycle of the PMA Rx clock 430 in this implementation may be 40 bits×VL_PMA. In certain 100 Gb/s implementations (e.g., a CAUI or CAUI2 standard), both the gearbox 410 and the gearbox 415 are active and each gearbox outputs a total of 20 bits×VL_PMA per clock cycle of the PMA Rx clock 430 (for a total output of 40 bits× VL_PMA per clock cycle).

The output from one or both the gearbox 410 and the gearbox 415 are provided to the block synchronization module 420, which frames data into 66-bit words. The block synchronization module 420 outputs a total of 66×VL_MAX bits per clock cycle.

The output from the block synchronization module 420 is provided to an alignment marker lock module 425 which uses alignment markers to lock onto each virtual lane. In certain implementations, the block synchronization module 420 achieves lock on a given virtual lane after detecting M consecutive alignment markers. Further, the block synchronization module 420 may determine that a lock condition has been lost if P consecutive alignment markers are not in their expect positions some time after lock is achieved.

As shown in FIG. 4, each of the gearbox 410, the gearbox 415, the block synchronization module 420, and the alignment marker lock module 425 operate according to the PMA Rx clock 430. Further, the phase compensation module 405 and a channel re-order module 435 operate, in part, according to the PMA Rx clock 430. In certain implementations, the PMA Rx clock 430 is derived from a clock signal from the clock distribution area 19 and/or based on one or more properties of the PMA module 26. In certain implementations, the PMA Rx clock 430 operates at a frequency of about 257 MHz.

The locked output data for each virtual lane is provided by the alignment marker lock module 425 to the channel re-order module 435. Virtual channels in the data output from the alignment marker lock module 425 may be out of order due to a variety of factors including electrical interference, and operation of various circuitry. The channel re-order module 435 identifies out of order virtual lanes and re-orders them using alignment markers present in the input to the channel re-order module 435. The channel re-order module 435 outputs data at 66×VL_MAX bits per clock cycle.

The output of the channel re-order module 435 is present to a deskew module 440. The deskew module 440 removes the relative skew between virtual channels. In certain implementations, the deskew module 440 may "freeze" data from early arriving virtual channels until data from the other virtual channels arrives. In this manner, the output of the deskew module 440 is synchronized across the VL_MAX virtual channels. The deskew module 440 outputs data at 66×VL_MAX bits per clock cycle.

Block destriper 445 reverse the operation performed by the block striper 325 and converts the data presented in VL_MAX virtual lanes into a single stream of output data. In certain implementations, the block destriper 445 aggregates bits from the VL_MAX virtual lanes into a single data stream in a round-robin fashion in 66-bit blocks. The output of the block destriper 445 is 66×VL_USER bits per clock cycle.

The output from block destriper 445 is provided to a descrambler 450. The descrambler 450 inverses, or reverses, the permutation operation performed by the scrambler 320. The descrambler 450 may be implemented using a linear feedback shift register. The descrambler 450 outputs 66×VL_USER bits of data per clock cycle.

The output from the descrambler 450 is provided to a decoder 455. The decoder 455 is a 64B/66B decoder that converts 66×VL_USER bits of input data into 64×VL_USER bits of output data per clock cycle. To do so, decoder 445 may remove, or reverse, the encoding process performed by the encoder 315. The decoder 455 outputs 64×VL_USER bits of data per clock cycle. In certain implementations, the output of the decoder 455 is provided to the PHY/MAC 28.

As shown in FIG. 4, each of the channel re-order module 435, deskew module 440, block destriper 445, descrambler 450, and decoder 455 are provided with a clock signal from a user clock 460. In an implementation, user clock 460 may be the same as the user clock 310. However, this is not necessary, and the user clock 460 and the user clock 310 may be derived from a single common source or from different sources.

Although the PCS receive module 400 has been described as operating on an input of 40 bits per virtual lane from the PMA module 26, it will be clear to one of ordinary skill in the art, based on the disclosure herein, that the PCS receive module 400 may be implemented using any other suitable bit-width. For example, the PCS receive module 400 may output 32 bits per virtual lane. Further, in certain implementations, the PCS receive module 400 is adaptive to determine a suitable bit-width based on one or more characteristics of the PMA module 26. Further, although not explicitly shown in FIG. 4, it will be clear to one of ordinary skill in the art, based on the disclosure herein, that various components of the PCS receive module 400 may have as input a data select or "wait and hold" signal that may be used to trigger access of data from those components.

Figure 5A:
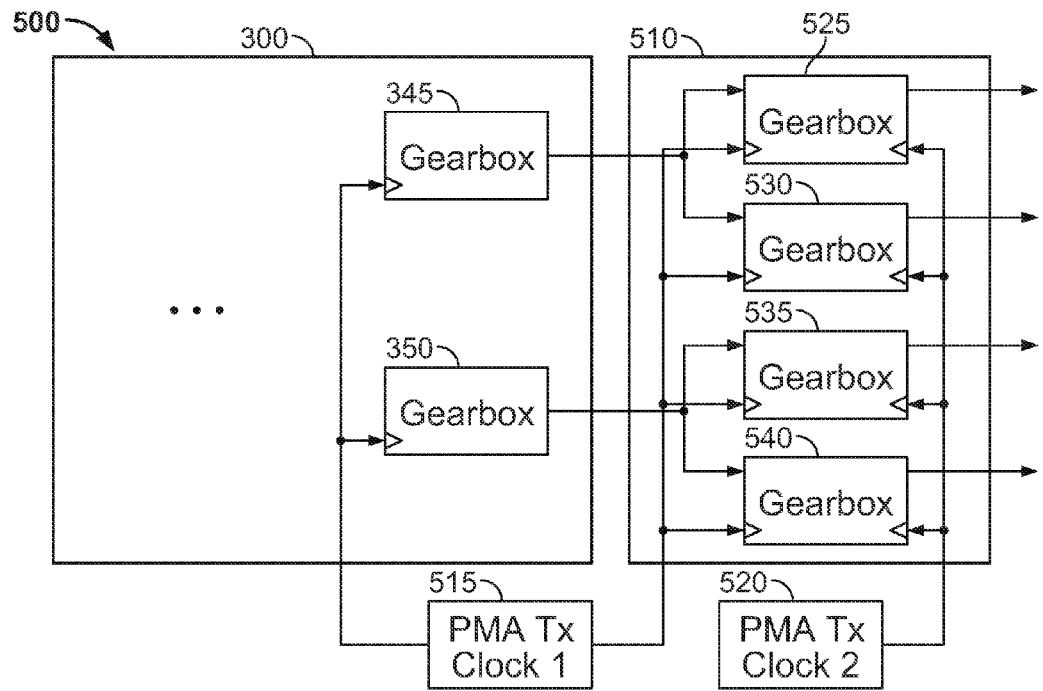
FIG. 5A is a schematic diagram of an exemplary configurable multi-standard PCS transmit module 500 that supports the CAUI-4 standard in accordance with the present invention.

FIG. 5A is a schematic diagram of an exemplary configurable multi-standard PCS transmit module 500 that supports the CAUI-4 standard in accordance with the present invention. The PCS transmit module 500 includes the PCS transmit module 300 (partially shown in FIG. 5A) and an adaptor unit 510. In one implementation, the PCS transmit module 300 represents an existing PCS device interface designed to work with a first standard, while the PMA module 26 may be designed to work with the CAUI-4 standard. In this case, the adaptor unit 510 may be used to interface the PCS transmit module 300 and the PMA module 26 to provide CAUI-4 support.

The PCS transmit module 500 may support a variety of standards based on selectively activating and deactivating various internal components. In a preferred implementation, PCS transmit module 500 supports some or all of the XLAUI, CAUI, CAUI-4, 100GBASE-LR4, and 100GBASE-ER4 standards. However, for simplicity, PCS transmit module 500 will be described in an arrangement that supports the XLAUI, CAUI, and CAUI-4, standards in the disclosure below. The PCS transmit module 500 advantageously enables an FPGA crossover from a 10 Gb/s design to the CAUI-4 standard without requiring significant IP redesign.

In a preferred implementation, the PCS transmit module 500, and hence the PCS transmit module 300, operates at 100 Gb/s. In this implementation, the PCS transmit module 300 produces an output of 20×VL_PMA=200 bits per clock cycle of a PMA Tx clock 1 515 from each of the gearbox 345 and the gearbox 350. In a preferred implementation, the PMA Tx clock 1 515 is the same as the PMA Tx clock 340, although this is not necessary.

The output of the gearbox 345 is divided into two streams of 100 bits per clock cycle each, and input to a gearbox 525 and a gearbox 530, respectively, of the adaptor unit 510. Similarly, the output of the gearbox 350 is divided into two streams, of 100 bits per clock cycle each, and input to a gearbox 535 and a gearbox 540, respectively, of the adaptor unit 510. As shown in FIG. 5A, the clock input to each of the gearboxes 525, 530, 535, and 540 is provided by the PMA Tx clock 1 515. In certain implementations, the PMA Tx clock 1 515 operates at about 257 MHz.

The output of each of the gearboxes 525, 530, 535, and 540 is produced at a rate of 128 bits per output clock cycle in a preferred implementation. Further, as shown in FIG. 5A, the output of each the gearboxes 525, 530, 535, and 540 is clocked by a PMA Tx clock 2 520. In certain implementations, the PMA Tx clock 2 520 operates at about 201.416 MHz. As specified by the CAUI-4 standard, the total output from each of the gearboxes 525, 530, 535, and 540 is about 25 Gb/s. For example, in an implementation, the output of each of the gearboxes 525, 530, 535, and 540 is produced at a rate of 128 bits per output clock cycle and the PMA Tx clock 2 520 operates at about 201.416 MHz, which produces an output of about 25.78125 Gb/s from each of the gearboxes 525, 530, 535, and 540.

In a preferred implementation, the PCS transmit module 500 autodetermines whether the PMA module 26 operates according to the CAUI-4 standard, and only activates the adaptor unit 510 if the PMA module 26 supports CAUI-4. If the PMA module 26 does not support CAUI-4, then the PCS transmit module 500 may simply deactivate the adaptor unit 510 and process data according to the PCS transmit module 300 (e.g., as described in relation to FIG. 3).

It will be clear to one of ordinary skill in the art, based on the disclosure herein, that the PMA Tx clock 1 515 and the PMA Tx clock 2 520 may each be derived from a common source or from different sources.

Figure 5B:
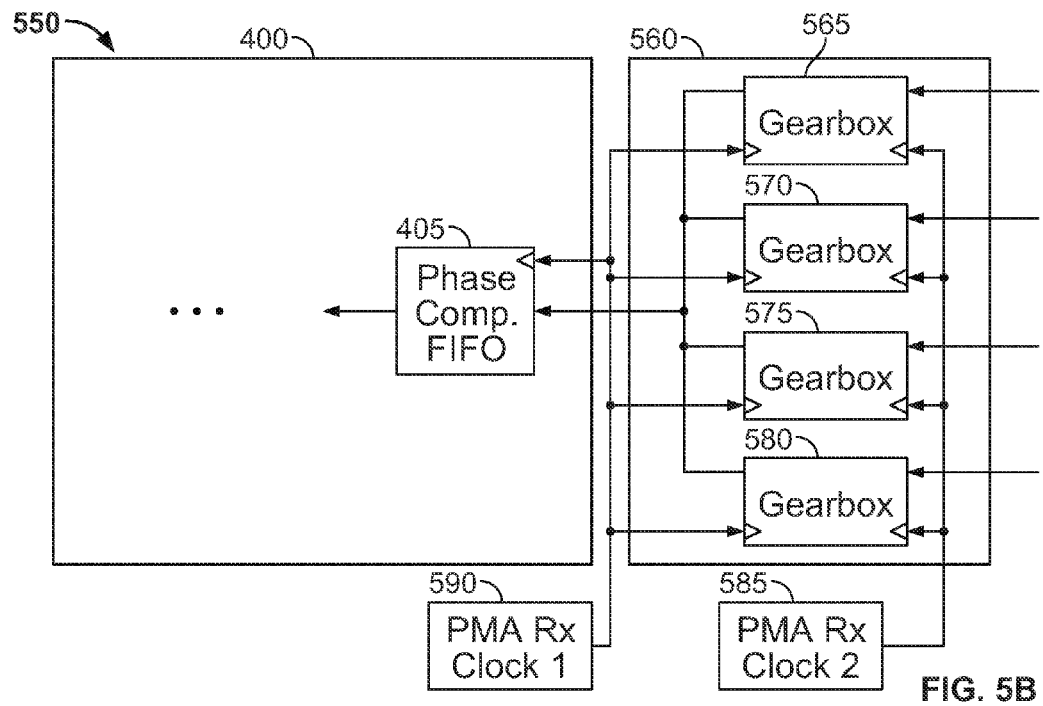
FIG. 5B is a schematic diagram of an exemplary configurable multi-standard PCS receive module 550 that supports the CAUI-4 standard in accordance with the present invention.

FIG. 5B is a schematic diagram of an exemplary configurable multi-standard PCS receive module 550 that supports the CAUI-4 standard in accordance with the present invention. The PCS receive module 550 includes the PCS receive module 400 (partially shown in FIG. 5B) and an adaptor unit 560. In one implementation, the PCS receive module 400 represents an existing PCS device interface designed to work with a first standard, while the PMA module 26 may be designed to work with the CAUI-4 standard. In this case, the adaptor unit 560 may be used to interface the PCS receive module 400 and the PMA module 26 to provide CAUI-4 support.

The PCS receive module 550 may support a variety of standards based on selectively activating and deactivating various internal components. In a preferred implementation, PCS receive module 550 supports some or all of the XLAUI, CAUI, CAUI-4, 100GBASE-LR4, and 100GBASE-ER4 standards. However, for simplicity, PCS receive module 550 will be described in an arrangement that supports XLAUI, CAUI, and CAUI-4, standards in the disclosure below. The PCS receive module 550 advantageously enables an FPGA crossover from a 10 Gb/s design to the CAUI-4 standard without requiring significant IP redesign.

In a preferred implementation, the PCS receive module 550, and hence the PCS receive module 400, operates at 100 Gb/s. In this implementation, the PCS receive module 400 operates with an input of 40×VL_PMA=400 bits per clock cycle of a PMA Rx clock 1 590. In a preferred implementation, the PMA Rx clock 1 590 is the same as the PMA Rx clock 430, although this is not necessary.

The output of each of gearboxes 565, 570, 575, and 580 is 100 bits per clock cycle of the PMA Rx clock 1 590, and these outputs are combined into a single data stream of 400 bits per clock cycle of the PMA Rx clock 1 590 which is input to the phase compensation module 405. As shown in FIG. 5B, the clock input to each of the gearboxes 565, 570, 575, and 580 is provided by a PMA Rx clock 2 585. In certain implementations, the PMA Rx clock 1 590 operates at about 257 MHz, while the PMA Rx clock 2 585 operates at about 201.416 MHz. The input to each of the gearboxes 565, 570, 575, and 580 is received at a rate of 128 bits per input clock cycle. As specified by the CAUI-4 standard, the input to each of the gearboxes 565, 570, 575, and 580 is about 25 Gb/s.

In a preferred implementation, the PCS receive module 550 autodetermines whether the PMA module 26 operates according to the CAUI-4 standard, and only activates the adaptor unit 560 if the PMA module 26 supports CAUI-4. If the PMA module 26 does not support CAUI-4, then the PCS receive module 550 may simply deactivate the adaptor unit 560 and process data according to the PCS receive module 400 (e.g., as described in relation to FIG. 4).

It will be clear to one of ordinary skill in the art, based on the disclosure herein, that the PMA Rx clock 1 590 and the PMA Rx clock 2 585 may each be derived from a common source or from different sources and that the PMA Rx clock 1 590 may be the same as the PMA Rx clock 430.

Although each of the PCS transmit module 500 and the PCS receive module 550 have been described as operating on an 40 bits per virtual lane, it will be clear to one of ordinary skill in the art, based on the disclosure herein, that each of the PCS transmit module 500 and the PCS receive module 550 may be implemented using any other suitable bit-width. For example, in an implementation, the PCS transmit module 500 and the PCS receive module 550 may operate at 32 bits per virtual lane. In this implementation, the inputs to each of the gearboxes 525, 530, 535, and 540 may be at 80 bits per input clock cycle, and the PMA Tx clock 1 515 may operate at about 322.27 MHz. Similarly, the outputs of each of the gearboxes 565, 570, 575, and 580 may be at 80 bits per output clock cycle, and the PMA Rx clock 1 590 may operate at about 322.27 MHz.

Although not explicitly shown in FIGS. 5A and 5B, it will be clear to one of ordinary skill in the art, based on the disclosure herein, that various components of the PCS transmit module 500 and the PCS receive module 550 may have as input a data select or "wait and hold" signal that may be used to trigger access to data from those components.

Figure 6:
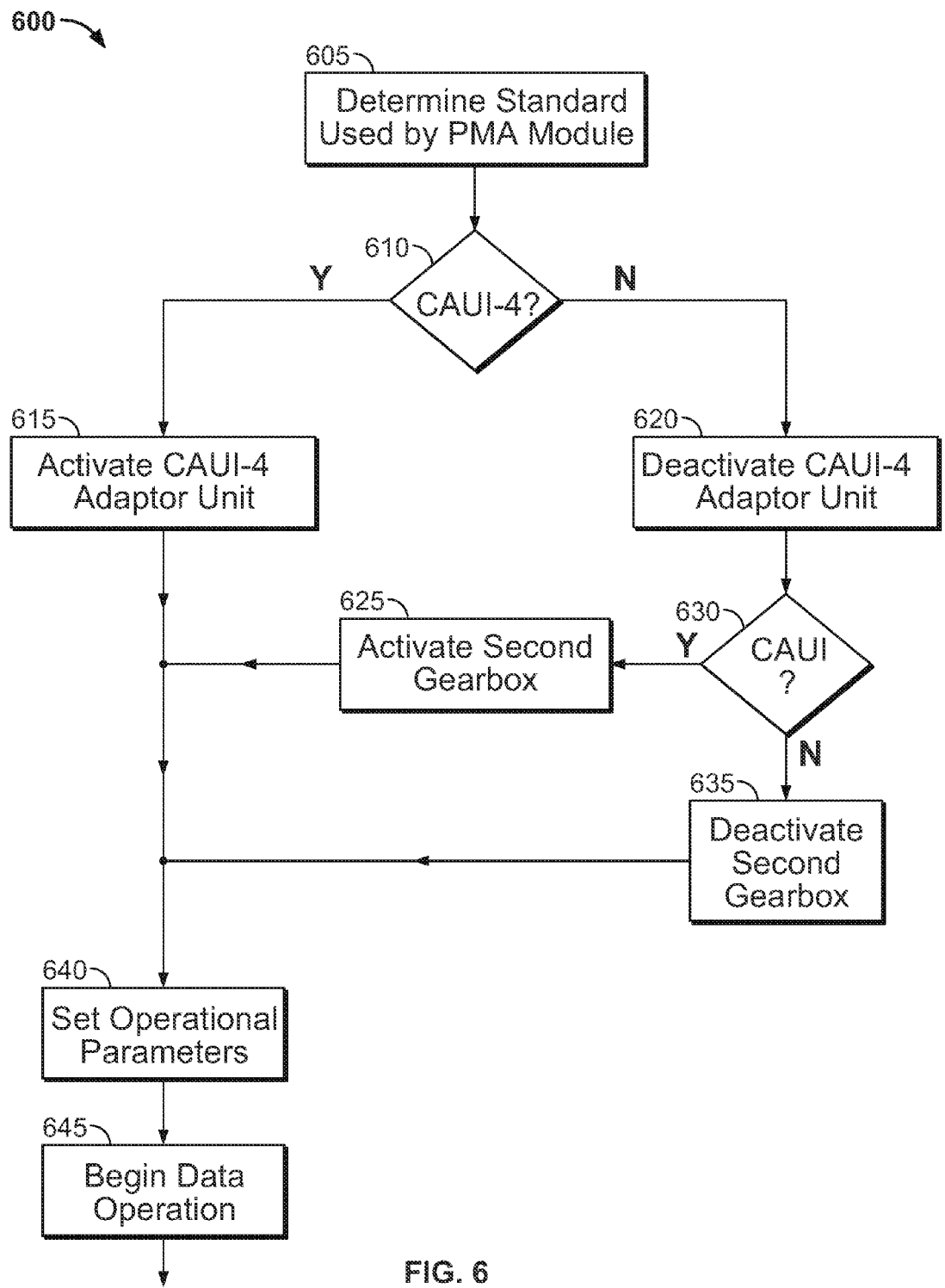
FIG. 6 shows an illustrative process for adapting a PCS receive interface to operate according one of a plurality of standards in accordance with the present invention.

FIG. 6 shows an illustrative process for adapting a PCS receive interface to operate according one of a plurality of standards, e.g., Ethernet standards, in accordance with the present invention. Process 600 is implemented in the PCS receive module 550 to select between operational according to the XLAUI, CAUI, or CAUI-4 standard, depending on the standard used by the PMA module 26. In certain implementations, the process 600 is implemented in firmware and the steps of the process 600 are performed by a processor located within the PCS receive module 550. In certain implementations, the PCS receive module 550 includes dedicated circuitry to perform some or all of the steps of the process 600.

At step 605, the process 600 determines a standard used by the PMA module 26 from among XLAUI, CAUI, and CAUI-4. In certain implementations, the process 600 may determine this information from data received from the receive auto negotiator 465. In certain implementations, the process 600 accesses one or more transmission parameters used by the PMA module 26 and determine the standard used by the PMA module 26 based on these parameters. For example, the process 600 may have access to a speed parameter (either a specified speed such as 40 Gb/s or an actual speed such as 39.864 Gb/s), a duplex mode parameter (e.g., half or full duplex), a flow control parameter (e.g., a waiting time or a sliding window parameter), and/or a congestion control parameter. In certain arrangements, the process 600 reads incoming data which specifically identifies the standard used by the PMA module 26.

At step 610, the process 600 evaluates whether the standard used by the PMA module 26 is the CAUI-4 standard. If so, the process 600 proceeds to step 615, where the CAUI-4 adaptor unit 560 is activated, and then proceeds to step 640. If, on the other hand, the standard used by the PMA module 26 is not the CAUI-4 standard, then the process 600 proceeds to step 620, where the CAUI-4 adaptor unit 560 is deactivated, before proceeding to step 630. Activation and deactivation of the CAUI-4 adaptor unit 560 may be performed by means of an enable or disable signal input to the CAUI-4 adaptor unit 560, by use of one or more multiplexers, and/or by any other suitable means.

At the step 630, the process 600 evaluates whether the standard used by the PMA module 26 is the CAUI standard. If so, the process 600 proceeds to step 625, where a second gearbox, i.e., the gearbox 415 is activated, and then proceeds to the step 640. If, on the other hand, the standard used by the PMA module 26 is not the CAUI standard, then the process 600 proceeds to step 635, where the second gearbox, i.e., the gearbox 415, is deactivated, before proceeding to the step 640.

At the step 640, the process 600 sets one or more operational parameters of the PCS receive module 550 based on the standard used by the PMA module 26 determined at the step 610. For example, the process 600 may set values for one or more of the VL_USER, VL_PMA, and VL_MAX variables at the step 640. In certain implementations, the values of these parameters for the standard determined at the step 610, as well as other standards, are stored in memory and accessed by the process 600. The process 600 proceeds to step 645, where a data operation begins. For example, the process 600 may send an acknowledgement signal or a clear to send signal to commence the data reception process at the step 645.

Although the process 600 has been described as being used to interface with the XLAUI, CAUI, and CAUI-4 standards, it will be clear to one of ordinary skill in the art, based on the disclosure herein, that the process 600 may be modified to accommodate more and/or different standards as well. For example, the process 600 may be modified to accommodate other suitable Ethernet standards.

Further, although the process 600 has been described as being used by the PCS receive module 550, it will be clear to one of ordinary skill in the art, based on the disclosure herein, that the process 600 may be suitably modified and implemented in the PCS transmit module 500 to allow the PCS transmit module 500 to adapt its architecture and operation parameters to a standard used by the PMA module 26. In such implementations, the CAUI-4 adaptor unit 510 may be activated and deactivated at the steps 615 and 620, respectively (rather than the CAUI-4 adaptor unit 560, as described above). Further, the gearbox 350 may be activated or deactivated at the steps 625 and 635, respectively (rather than the gearbox 415, as described above).

Further, although the present disclosure has been described as applying to 40 Gb/s and 100 Gb/s implementations, it will be clear to one of ordinary skill in the art, that many other speeds may be accommodated by the techniques, systems, and methods described herein. For example, 400 Gb/s Ethernet standard of 16 physical lanes of about 25 Gb/s bandwidth each may be supported by combining four of the architectures described in relation to FIGS. 5A and 5B.

Further, it will be understood by one of ordinary skill in the art that some of the architectures shown in FIGS. 3-5B may include additional test hardware. For example, any of the architectures described in FIGS. 3-5B may include bypass circuitry (e.g., multiplexers) for bypassing pictured elements during test or diagnostic modes.

Further, it will be understood that the foregoing is only illustrative of the principles of the invention, and that various modifications may be made by those skilled in the art without departing from the scope and spirit of the invention, and the present invention is limited only by the claims that follow.

What is claimed is:

1. A configurable interface comprising:
    a transmitter module for operating according to at least two different interface standards, the transmitter module comprising:
        a first gearbox circuitry for converting a stream of input data into output data across one of a first and a second number of virtual lanes, wherein the first number of virtual lanes corresponds to a first standard of the at least two different interface standards and the second number of virtual lanes corresponds to a second standard of the at least two different interface standards;
    a receiver module for operating according to said at least two different interface standards, the receiver module comprising:
        a second gearbox circuitry for selectively processing the output data from the first gearbox circuitry according to one of the at least two different interface standards; and
        an adaptor unit comprising a gearbox module configured to receive a set of data as input at a first data rate according to a first clock rate, and produce the set of data as output at a second data rate according to a second clock rate, wherein the first data rate, the second data rate, the first clock rate, and the second clock rate are chosen so that an asynchronous first-in first-out module of the gearbox module operates as a stable buffer between the input and the output; and
    an interface module for:
        determining a physical medium attachment (PMA) standard of a PMA coupled to the configurable interface, wherein the PMA standard is one of the at least two different interface standards;
        activating the second gearbox circuitry for selectively processing the output data from the first gearbox circuitry according to the determined PMA standard; and
        activating the adaptor unit in response to the determined PMA standard.

2. The configurable interface of claim 1, wherein the interface module activates a gearbox module of the receiver module in response to the determined PMA standard.

3. The configurable interface of claim 1, wherein the at least two different interface standards comprises a CAUI-4 standard.

4. The configurable interface of claim 1, wherein the adaptor unit comprises four gearbox modules.

5. The configurable interface of claim 1, wherein the receiver module comprises six gearbox modules.

6. A method for configuring an interface in an integrated circuit device, said method comprising:
    converting, with a first gearbox circuitry, a stream of input data into output data across one of a first and a second number of virtual lanes, wherein the first number of virtual lanes corresponds to a first standard of at least two different interface standards and the second number of virtual lanes corresponds to a second standard of the at least two different interface standards;
    determining a physical medium attachment (PMA) standard of a PMA coupled to the integrated circuit device, wherein the PMA standard is one of the at least two different interface standards;
    selecting a plurality of operating parameters of the interface based on the determined PMA standard;
    activating a second gearbox circuitry for selectively processing the output data from the first gearbox circuitry according to the determined PMA standard; and
    activating an adaptor unit in response to the determined PMA standard, wherein the adaptor unit comprises a gearbox module for receiving a set of data as input at a first data rate according to a first clock rate, and producing the set of data as output at a second data rate according to a second clock rate, wherein the first data rate, the second data rate, the first clock rate, and the second clock rate are chosen so that an asynchronous first-in first-out module of the gearbox module operates as a stable buffer between the input and the output.

7. The method of claim 6, wherein the PMA standard is a CAUI-4 standard.

8. The method of claim 6, wherein the plurality of operating parameters comprises a maximum number of virtual lanes.

9. The method of claim 6, wherein the plurality of operating parameters comprises a number of virtual lanes used by the PMA.

10. The method of claim 6, further comprising:
    deactivating a component of the integrated circuit device in response to the determined PMA standard.

11. The method of claim 10, wherein the component is the adaptor unit of the integrated circuit device.

12. The method of claim 11, wherein the adaptor unit comprises four gearbox devices.

13. A configurable interface comprising:
    a first gearbox circuitry for converting a stream of input data into output data across one of a first and a second number of virtual lanes, wherein the first number of virtual lanes corresponds to a first standard of the at least two different interface standards and the second number of virtual lanes corresponds to a second standard of the at least two different interface standards;
    a second gearbox circuitry for selectively processing the output data from the first gearbox circuitry according to one of the at least two different interface standards;
    an adaptor unit comprising a gearbox module configured to receive a set of data as input at a first data rate according to a first clock rate, and produce the set of data as output at a second data rate according to a second clock rate, wherein the first data rate, the second data rate, the first clock rate, and the second clock rate are chosen so that an asynchronous first-in first-out module of the gearbox module operates as a stable buffer between the input and the output;
    an interface module configured to determine a physical medium attachment (PMA) standard of a PMA coupled to the configurable interface, wherein the PMA standard is one of the at least two different interface standards, and to activate the adaptor unit in response to the determined PMA standard; and a configuration module operable to set a plurality of operating parameters of the configurable interface in response to the determined PMA standard and to activate the second gearbox circuitry to selectively process the output data from the first gearbox circuitry according to the determined PMA standard.

14. The configurable interface of claim 13, wherein the PMA standard is a CAUI-4 standard.

15. The configurable interface of claim 13, wherein the plurality of operating parameters comprises a maximum number of virtual lanes.

16. The configurable interface of claim 13, wherein the plurality of operating parameters comprises a number of virtual lanes used by the PMA.

17. The configurable interface of claim 13, wherein the configuration module is further operable to activate a CAUI-4 adaptor unit in response to the determined PMA standard.

18. The configurable interface of claim 13, further comprising an alignment marker module for inserting alignment markers into each virtual lane of the one of the first and the second number of virtual lanes.

* * * * *